(12) United States Patent
Chen et al.

(10) Patent No.: US 8,080,443 B2
(45) Date of Patent: *Dec. 20, 2011

(54) METHOD OF MAKING PILLARS USING PHOTORESIST SPACER MASK

(75) Inventors: Yung-Tin Chen, Santa Clara, CA (US);
Chun-Ming Wang, Fremont, CA (US);
Steven J. Radigan, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 537 days.

This patent is subject to a terminal disclaimer.

(21) Appl. No.: 12/289,396

(22) Filed: Oct. 27, 2008

(65) Prior Publication Data

US 2010/0105210 A1 Apr. 29, 2010

(51) Int. Cl.
*H01L 21/44* (2006.01)

(52) U.S. Cl. ........ 438/106; 438/286; 438/297; 438/669; 438/671; 438/689; 257/E21.038

(58) Field of Classification Search .................. None
See application file for complete search history.

(56) References Cited

U.S. PATENT DOCUMENTS

| | | | |
|---|---|---|---|
| 5,915,167 A | 6/1999 | Leedy | |
| 5,916,821 A | 6/1999 | Kerber | |
| 5,977,638 A | 11/1999 | Rodgers et al. | |
| 6,055,180 A | 4/2000 | Gudesen et al. | |
| 6,362,057 B1 | 3/2002 | Taylor | |
| 6,420,231 B1 | 7/2002 | Harari et al. | |
| 6,706,571 B1 | 3/2004 | Yu | |
| 6,853,049 B2 | 2/2005 | Herner | |
| 6,893,972 B2 | 5/2005 | Rottstegge | |
| 6,946,719 B2 | 9/2005 | Petti et al. | |
| 6,952,030 B2 | 10/2005 | Herner et al. | |

(Continued)

FOREIGN PATENT DOCUMENTS

WO 04001799 A2 12/2003

(Continued)

OTHER PUBLICATIONS

International Preliminary Report on Patentability issued in PCT Application PCT/US2009/061643, mailed on May 3, 2011.

(Continued)

*Primary Examiner* — N Drew Richards
*Assistant Examiner* — Kyoung Lee
(74) *Attorney, Agent, or Firm* — The Marbury Law Group, PLLC

(57) ABSTRACT

A method of making a device includes forming a first hard mask layer over an underlying layer, forming first features over the first hard mask layer, forming a first spacer layer over the first features, etching the first spacer layer to form a first spacer pattern and to expose top of the first features, removing the first features, patterning the first hard mask using the first spacer pattern as a mask to form first hard mask features, removing the first spacer pattern. The method also includes forming second features over the first hard mask features, forming a second spacer layer over the second features, etching the second spacer layer to form a second spacer pattern and to expose top of the second features, removing the second features, etching the first hard mask features using the second spacer pattern as a mask to form second hard mask features, and etching at least part of the underlying layer using the second hard mask features as a mask.

29 Claims, 11 Drawing Sheets

U.S. PATENT DOCUMENTS

| | | |
|---|---|---|
| 7,081,377 B2 | 7/2006 | Cleeves |
| 7,176,064 B2 | 2/2007 | Herner |
| 7,211,866 B2 | 5/2007 | Yuan et al |
| 7,786,015 B2 | 8/2010 | Chen |
| 7,846,756 B2 * | 12/2010 | Yen et al. ............... 438/42 |
| 2004/0245557 A1 | 12/2004 | Seo et al. |
| 2005/0052915 A1 | 3/2005 | Herner et al. |
| 2005/0226067 A1 | 10/2005 | Herner et al. |
| 2006/0250836 A1 | 11/2006 | Herner et al. |
| 2006/0250837 A1 | 11/2006 | Herner et al. |
| 2006/0273298 A1 | 12/2006 | Petti |
| 2007/0049035 A1 | 3/2007 | Tran |
| 2007/0049040 A1 | 3/2007 | Bai |
| 2007/0072360 A1 | 3/2007 | Kumar et al. |
| 2007/0114509 A1 | 5/2007 | Herner |
| 2007/0164309 A1 | 7/2007 | Kumar et al. |
| 2007/0190762 A1 | 8/2007 | Van Haren |
| 2007/0215960 A1 | 9/2007 | Zhu |
| 2008/0013364 A1 | 1/2008 | Kumar et al. |
| 2008/0076070 A1 | 3/2008 | Koh |
| 2008/0090419 A1 | 4/2008 | Koh |
| 2009/0155962 A1 | 6/2009 | Petti |
| 2009/0268508 A1 | 10/2009 | Chen |
| 2010/0167520 A1 | 7/2010 | Chen |

FOREIGN PATENT DOCUMENTS

| | | |
|---|---|---|
| WO | 2008150430 A1 | 12/2008 |
| WO | 2009088587 A2 | 7/2009 |

OTHER PUBLICATIONS

International Search Report & Written Opinion, PCT/US2010/038125; Sep. 13, 2010.

Mercha et al., "Grain Boundary Trap Passivation in Polysilicon Thin Film Transistor Investigated by Low Frequency Noise," Thin Solid Films 383 (2001), pp. 303-306.

Chen et al., "Passivation Effect of Poly-Si Thin-Film Transistors with Fluorine-Ion-Implanted Spacers ," IEEE Electron Device Letters, vol. 29, No. 6, Jun. 2008, pp. 603-605.

Kim et al., "Poly-Si TFT Fabricated by Laser-Induced In-Situ Fluorine Passivation and and Laser Doping," IEEE Electron Device Letters, vol. 22, No. 8, Aug. 2001, pp. 396-398.

Aleksandrova et al., "Characteristics of Polysilicon TFTs, Hydrogenated by Ion Implantation of P-Channel," Journal of Optoelectronics & Advanced Materials, vol. 7, No. 1, Feb. 2005, pp. 313-316.

U.S. Appl. No. 09/560,626, filed Apr. 28, 2000, Knall.
U.S. Appl. No. 11/864,205, filed Sep. 28, 2007, Yung-Tin Chen et al.
U.S. Appl. No. 11/864,532, filed Sep. 28, 2007, Maxwell.
U.S. Appl. No. 12/000,758, filed Dec. 17, 2007, Petti et al.
U.S. Appl. No. 12/007,780, filed Jan. 15, 2008, Herner et al.
U.S. Appl. No. 12/007,781, filed Jan. 15, 2008, Dunton et al.
U.S. Appl. No. 12/216,107, filed Jun. 30, 2008, Chan.
U.S. Appl. No. 12/149,151, filed Apr. 28, 2008, Chen et al.
U.S. Appl. No. 12/222,293, filed Aug. 6, 2008, Chan.

Kim, Ryoung H. et al., "Double Exposure Using 193 nm Negative Tone Photoresist", Optical Microlithography XX, Proc of SPIE, vol. 6520, 65202M, 2007, 8 pgs.

Nakamura, Hiroko et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.

Nakamura, Hiroko et al., "Low $k_1$ Contact Hole Formation by Double Line and Space Formation Method with Contact Hole Mask and Dipole Illumination", The Japan Society of Applied Physics, vol. 45, No. 6B, 2000, pp. 5409-5417.

* cited by examiner

METHOD OF MAKING PILLARS USING PHOTORESIST SPACER MASK

BACKGROUND OF THE INVENTION

The invention relates generally to a method for making a semiconductor device, for example, a nonvolatile memory array containing a diode.

One prior art process using a hard mask stack shown in FIG. 1A can be used to fabricate 45 nm and 80 nm features. The stack consists of a layer of organic hard mask 103, also known as an amorphous carbon advanced patterning film (APF), a layer of Dielectric Anti-Reflective Coating (DARC) 106, such as silicon oxynitride, on top of organic hard mask 103, and a Bottom Anti-Refection Coating (BARC) 109 layer, such as an organic BARC layer, on top of DARC layer 106. A photoresist 111 can be coated above the BARC layer. A device layer 110 can be etched using at least one or more layers of the stack as a mask.

SUMMARY OF THE EMBODIMENTS

One embodiment of the invention provides a method of making a device, including forming a first hard mask layer over an underlying layer, forming first features over the first hard mask layer, forming a first spacer layer over the first features, etching the first spacer layer to form a first spacer pattern and to expose top of the first features, removing the first features, patterning the first hard mask using the first spacer pattern as a mask to form first hard mask features, removing the first spacer pattern, forming second features over the first hard mask features, forming a second spacer layer over the second features, etching the second spacer layer to form a second spacer pattern and to expose top of the second features, removing the second features, etching the first hard mask features using the second spacer pattern as a mask to form second hard mask features, and etching at least part of the underlying layer using the second hard mask features as a mask.

Another embodiment of the invention provides a method of making a device, including forming a first hard mask layer over a plurality of underlying layers, wherein the plurality of underlying layers comprise a resistivity switching storage element layer and an underlying hard mask layer over the resistivity switching storage element layer, forming first features over the first hard mask layer, forming a first spacer layer over the first features, etching the first spacer layer to form first spacer pattern to expose top of the first features, removing the first features, etching the first hard mask using the first spacer pattern as a mask to form first hard mask features, removing the first spacer pattern, forming second features over the first hard mask features, forming a second spacer layer over the second features, etching the second spacer layer to form a second spacer pattern to expose top of the second features, etching the first hard mask layer to form second hard mask features using the second spacer pattern as a mask, etching at least the resistivity switching storage element layer and the underlying hard mask layer, using the second hard mask features as a mask, to form first openings, filling the first openings with an insulating material, removing the second hard mask features, forming second openings exposing top of the resistivity switching storage element layer by removing the underlying hard mask layer, and filling the second openings with at least one semiconductor material to form semiconductor diodes having a substantially pillar shape in the second openings.

Another embodiment of the invention provides a method of making a device, including forming a first hard mask layer over an underlying layer, forming first features over the first hard mask layer, forming a first spacer layer over the first features, etching the first spacer layer to form a first spacer features and to expose top of the first features forming first openings located between the first spacer features, filling the first openings with first filler features, removing the first spacer features, patterning the first hard mask using the first features and the first filler features as a mask, to form first hard mask features, removing the first features and the first filler features.

The method further includes forming second features over the first hard mask features, forming a second spacer layer over the second features, etching the second spacer layer to form second spacer features, and to expose top of the second features forming second openings located between the second spacer features, filling the second openings with second filler features, removing the second spacer features, etching the first hard mask features, using the second features and the second filler features as a mask, to form second hard mask features, and etching at least part of the underlying layer using the second hard mask features as a mask of making a device, including forming a first hard mask layer over an underlying layer, forming first features over the first hard mask layer, forming a first spacer layer over the first features, etching the first spacer layer to form a first spacer pattern and to expose top of the first features, removing the first features, patterning the first hard mask, using the first spacer pattern as a mask, to form first hard mask features, and etching at least part of the underlying layer using the first hard mask features as a mask.

BRIEF DESCRIPTION OF THE DRAWINGS

FIG. 4A and FIG. 4B are images of a center region and an edge region, respectively, of the wafer processed.

FIG. 5A and FIG. 5B are images of a center region and an edge region, respectively, of the wafer processed.

DETAILED DESCRIPTION OF THE PREFERRED EMBODIMENTS

One embodiment of the invention provides a method of making a device, including forming a first hard mask layer over an underlying layer, forming first features over the first hard mask layer, forming a first spacer layer over the first features, etching the first spacer layer to form a first spacer pattern and to expose top of the first features, removing the first features, patterning the first hard mask, using the first spacer pattern as a mask, to form first hard mask features, removing the first spacer pattern, forming second features over the first hard mask features, forming a second spacer layer over the second features, etching the second spacer layer to form a second spacer pattern and to expose top of the second features, removing the second features, etching the first hard mask features, using the second spacer pattern as a mask, to form second hard mask features, and etching at least part of the underlying layer using the second hard mask features as a mask.

In some embodiments, the first features comprise a plurality of first parallel lines extending in a first direction, and the second features comprise a plurality of second parallel lines extending in a second direction, wherein the second direction differs from the first direction by 30 to 90 degrees.

The first spacer layer and the second spacer layer may comprise a first material, and the first features and the second features comprise a second material different from the first material. For example, the first and second spacer layers may comprise oxide spacers, while the first features and the second features comprise photoresist features.

Figure 2A:
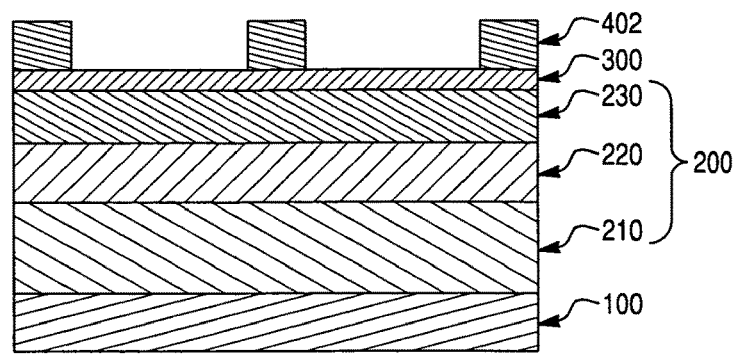
FIGS. 2A-2K are side cross-sectional view illustrating stages in formation of a device according to an embodiment of the present invention.

Referring to FIG. 2A, an underlying layer 200 is formed over a substrate 100. The substrate 100 can be any semiconductor substrate known in the art, such as monocrystalline silicon, IV-IV compounds such as silicon-germanium or silicon carbide, III-V compounds, II-VI compounds, epitaxial layers over such substrates, or any other semiconductor or non-semiconductor material, such as glass, plastic, metal or ceramic substrate. The substrate may include integrated circuits fabricated thereon, such as driver circuits and/or electrodes for a memory device.

The underlying layer 200 may comprise a second hard mask layer 230, an underlying hard mask layer 220, a device layer 210, or combinations thereof. For example, as shown in FIG. 2A, the underlying layer 200 may comprises a device layer 210, an underlying hard mask layer 220 formed over the device layer 210, and a second hard mask layer 230 formed over the underlying mask layer 220.

The second hard mask layer 230 may comprise any suitable hard mask material including oxide, nitride, polysilicon, amorphous silicon, or metal. In one preferred embodiment, the second hard mask layer 230 comprises a silicon oxide hard mask layer. In another preferred embodiment, the second hard mask layer 230 comprises polysilicon. Preferably, the second hard mask layer 230 comprise a material different from the material of the first hard mask layer 300, so that the second hard mask layer 230 may act as an etch stop during steps of etching the first hard mask layer 300. The second hard mask layer 230 may have any suitable thickness, and preferably has a thickness of 30 to 60 nanometers.

The underlying hard mask layer 220 may comprise any suitable hard mask materials, and in a preferred embodiment, comprises an organic hard mask, such as amorphous carbon (APF film). The underlying hard mask layer 220 may have a thickness of 1200 to 2500 nanometers. In an alternative embodiment, the first mask layer 300 may comprise an amorphous silicon layer and the underlying layer 200 comprises a DARC hard mask layer over the device layer 210. Other layer combinations may also be used.

The device layer 210 may comprise any suitable material, for example, semiconductor materials, insulating materials, or conductive materials. For example, in one preferred embodiment, the device layer 210 one or more is a polysilicon layers having a thickness of 1200 to 2500 nanometers.

A first mask layer 300 can be formed over the underlying layer 200. The first mask layer 300 may comprise any suitable hard mask material. In a preferred embodiment, the first mask layer 300 comprises a DARC layer, such as a silicon oxynitride layer, having a thickness from 15 to 40 nanometers. As noted above, layer 300 may comprise an a-Si layer instead.

First features 402 can then be formed over the first mask layer 300. As shown in FIG. 2A, the first mask layer 300 can be partially exposed in openings between the first features 402. In some embodiments, the first features 402 can be photoresist features or combination BARC and photoresist features. Alternatively, the first features 402 can be features comprising any other suitable materials, such as oxides, nitrides, or metals.

Figure 2B:
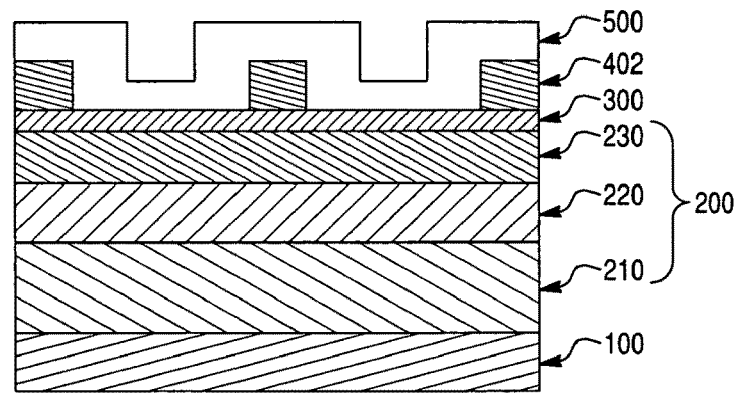

Turning to FIG. 2B, a first spacer layer 500 can be formed over the first features 402. The first spacer layer 500 comprises a first material different from the material of the first features 402. The spacer layer 500 may comprise any layer which is deposited at a sufficiently low temperature to avoid damaging the resist features 402 and which can withstand resist stripping without being removed. For example, layer 500 may comprise a low temperature silicon oxide layer deposited by atomic layer deposition (ALD or PLD) or by CVD at a temperature of 20-100, such as 80-100° C.

Figure 2C:
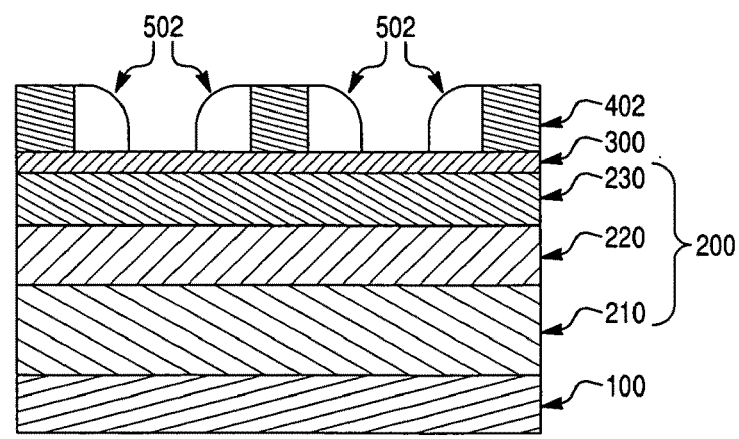
Figure 2D:
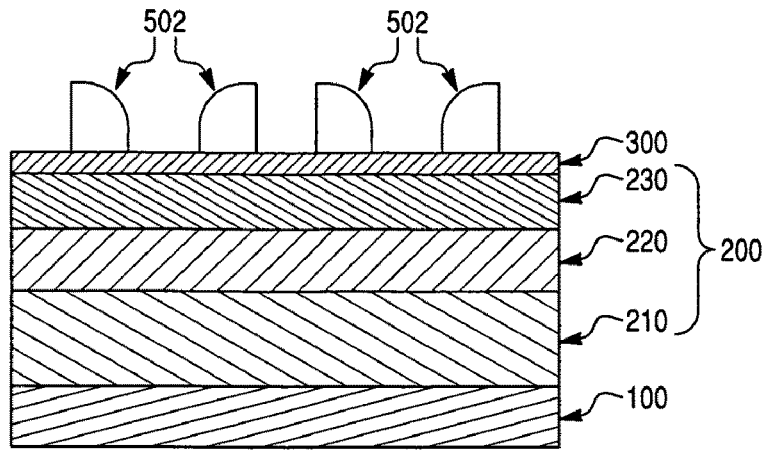

The first spacer layer 500 can then be etched using a spacer etch process to form a first spacer pattern (which can also be referred to as spacer features) 502 and to expose top of the first features 402, resulting in a structure illustrated in FIG. 2C. The first features 402 can then be removed (e.g., stripped) without removing pattern 502. The first spacer pattern 502, as shown in FIG. 2D, can be used as a mask in a following step of etching the first hard mask layer 300 to form first hard mask features 302. The first spacer pattern 502 can then be removed, resulting in a structure shown in FIG. 2E.

Figure 2E:
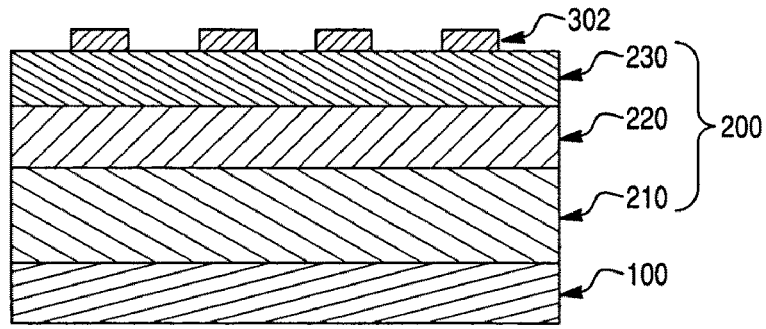
Figure 3A:
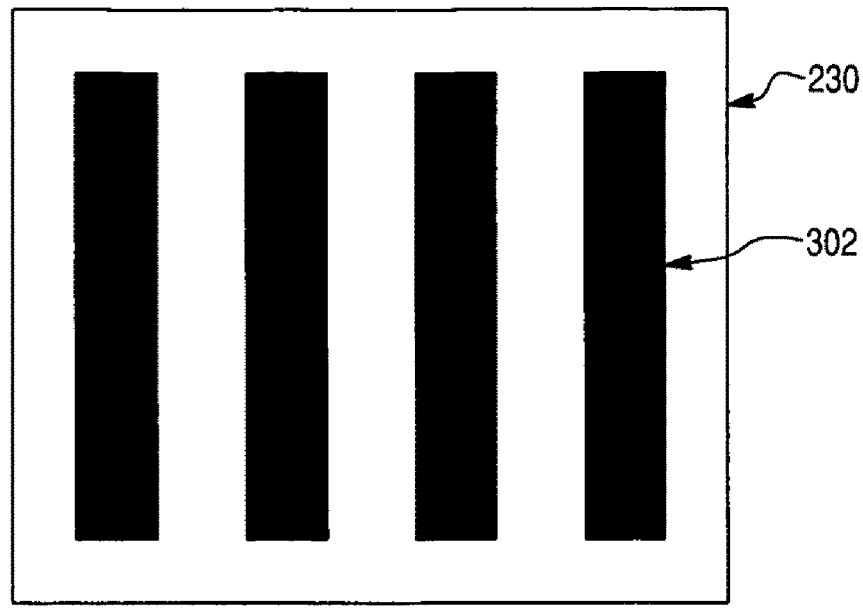
FIGS. 3A-3E are top views of the structures shown in FIGS. 2E-2I, respectively.
Figure 3B:
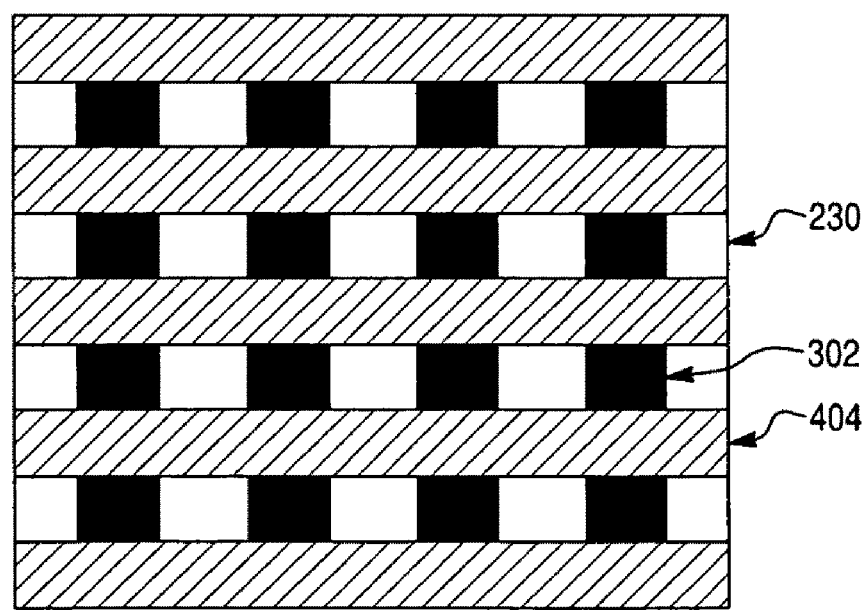
Figure 3C:
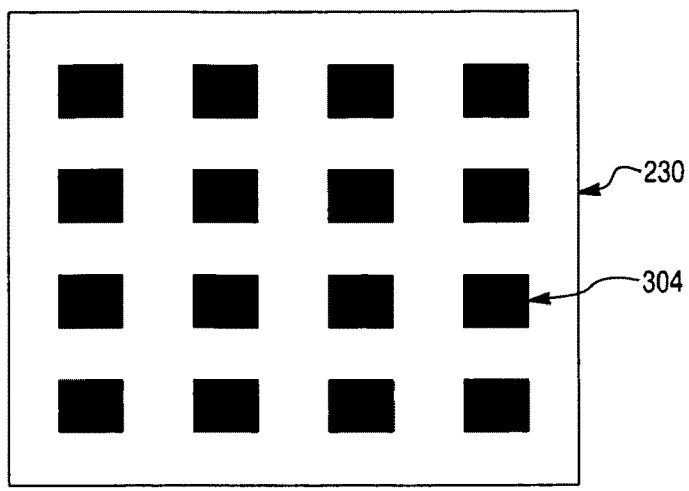
Figure 3D:
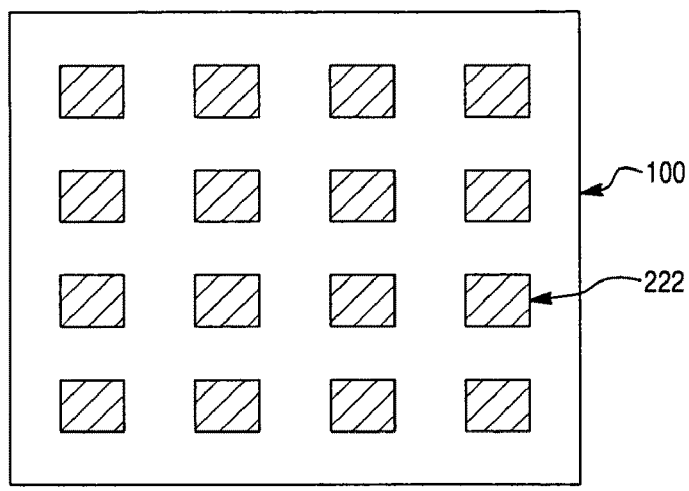
Figure 3E:
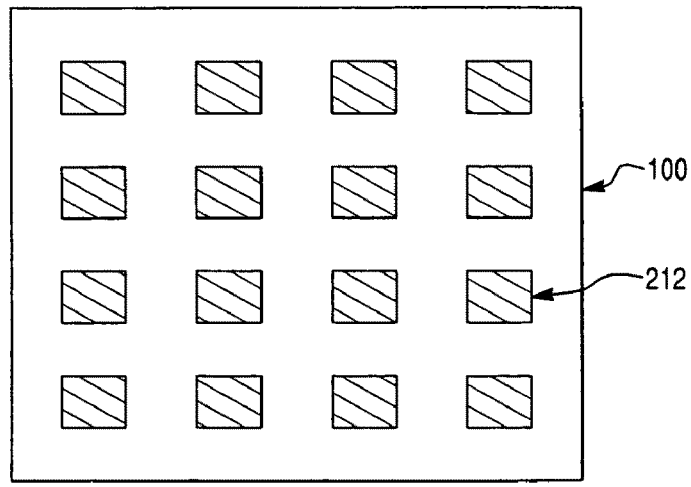

In some embodiments, the first features 402 comprise a plurality of first parallel lines extending in a first direction. Thus, the first hard mask features 302 formed by above steps may also comprise a plurality of parallel lines extending in the first direction, as illustrated in FIG. 3A (top view of the same structure shown in FIG. 2E).

Figure 4A:
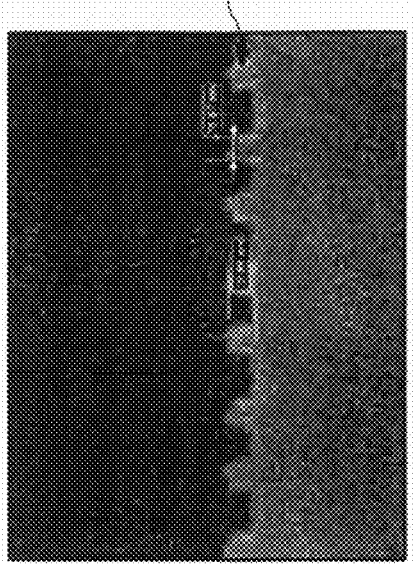
FIGS. 4A-4B are SEM side cross-sectional images of a first non-limiting example at the stage immediately prior to the step of removing the first spacer features.

As a first non-limiting working example, SEM side cross-sectional images taken immediately prior to the step of removing the first spacer pattern or features 502, are shown in FIGS. 4A (center region of the wafer) and 4B (edge region of the same wafer). In this non-limiting working example, the first features are photoresist features having a thickness of around 70-80 nanometers (which can be trimmed to 60-70 nm), the first hard mask layer 300 is a DARC layer having a thickness of around 20 nanometers, the second hard mask layer is an a-Si layer having a thickness of around 15-30 nanometers, and the spacer layer 500 comprises 25-35 nanometer silicon oxide.

Figure 5A:
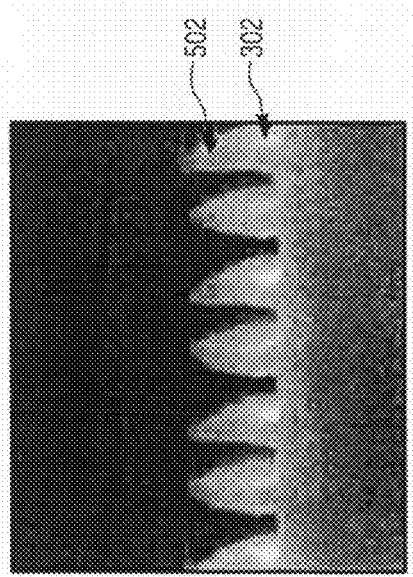
FIGS. 5A-5B are SEM side cross-sectional images of the first non-limiting example at the stage immediately after the step of removing the first spacer features.

The silicon oxide spacer pattern 502 is then removed by HF wet-etching. SEM side cross-sectional images of the resulting structure, after the HF wet etching, are shown in FIGS. 5A (center region of the wafer) and 5B (edge region of the same wafer). The same structure is schematically shown in FIG. 2E (side cross-sectional view) and 3A (top view).

Figure 4B:
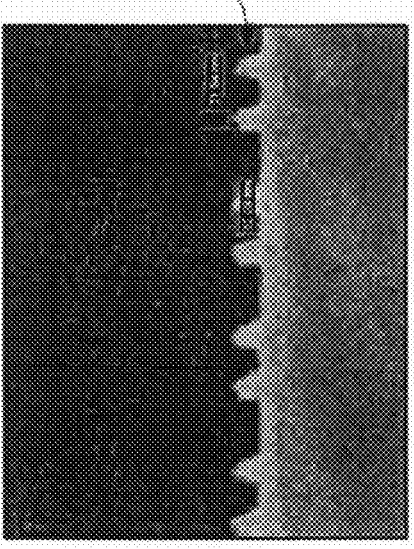
Figure 5B:
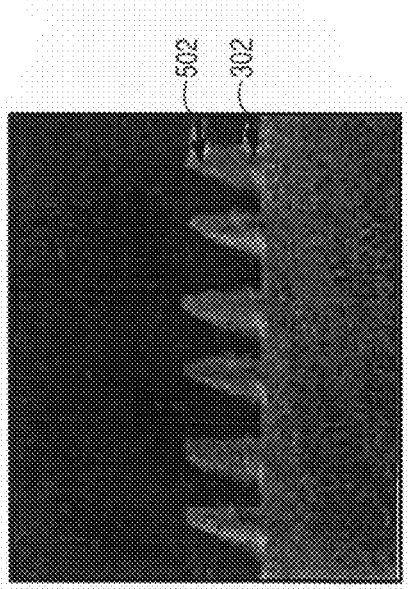

It appears that the resulting features located in the central region of a wafer (as shown in FIGS. 4A and 5A) have a larger critical dimension than those located in the edge region of the wafer (as shown in FIGS. 4B and 5B). Without wishing to be bound by a particular theory, this positional dependence of the critical dimension may be introduced by inhomogeneous depositing and/or etching the oxide spacer layer.

Figure 2F:
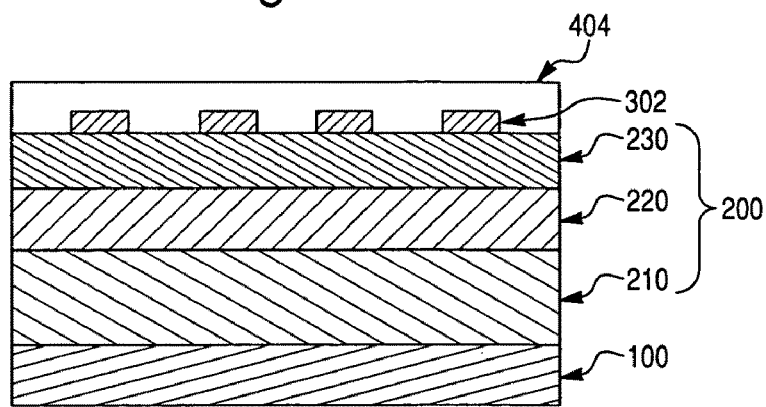

Turning to FIG. 2F, second features 404, comprising a plurality of second parallel lines extending in a second direction, can then be formed over and between the first hard mask features 302. The second direction can be any direction different from the first direction. In preferred embodiments, the second direction differs from the first direction by 30 to 90 degrees. For example, in some embodiments, a structure containing line-shaped second features 404 extending in a direction perpendicular to the line-shaped first hard mask features 302 as shown in FIG. 2F (side cross-sectional view) and 3B (top view) may be formed.

Optionally, a step of forming a BARC layer, such an organic layer over and between the first hard mask features 302 may be conducted prior to the step of forming the second features 404. In a preferred embodiment, the BARC layer is formed by liquid phase depositing BARC material. Thus, the second features 404 comprise photoresist features patterned by photolithography. One advantage of this embodiment is that the BARC material formed by liquid phase deposition over and between the first hard mask features 302 settles into spaces between features 302 and provides a flatter starting surface over which the second features 404 can be formed.

Figure 2G:
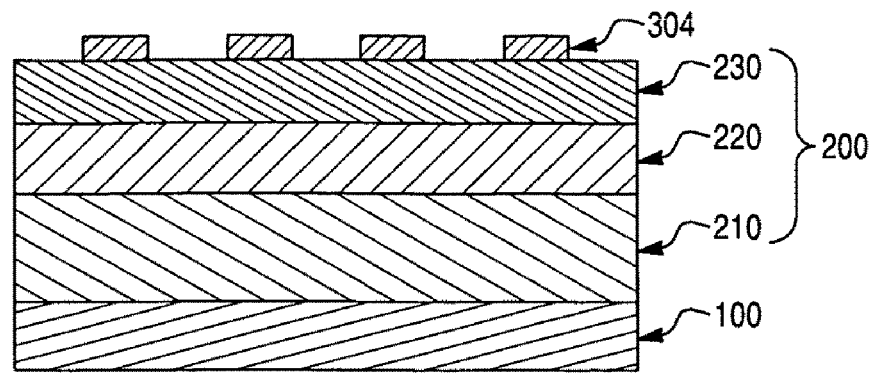
Figure 2H:
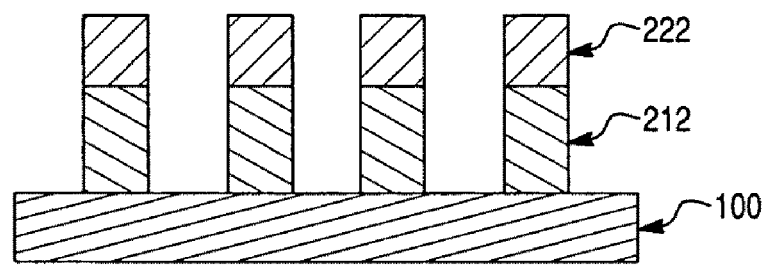
Figure 2I:
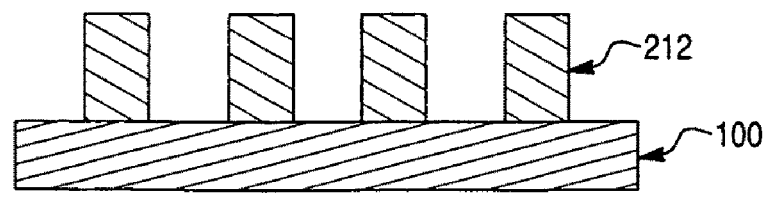
Figure 2J:
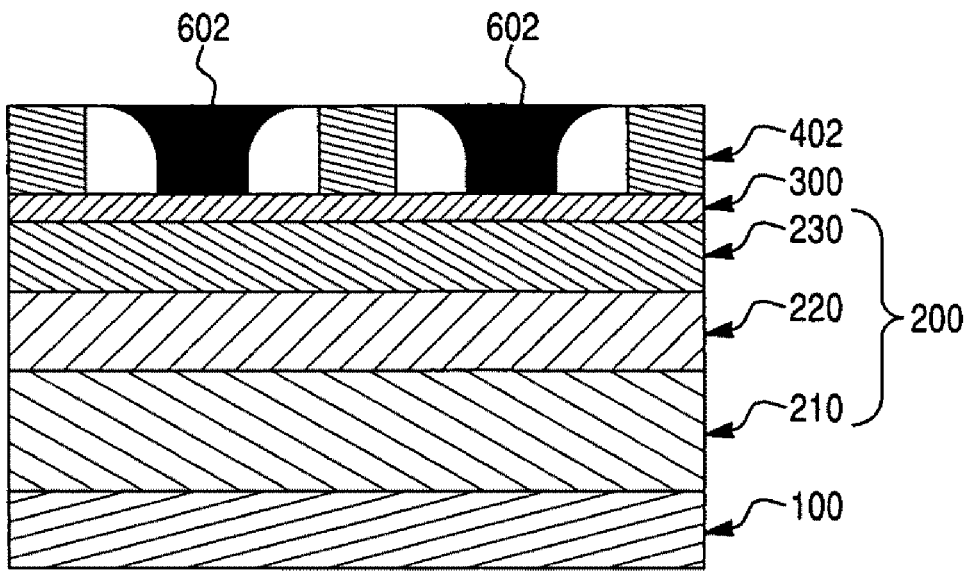
Figure 2K:
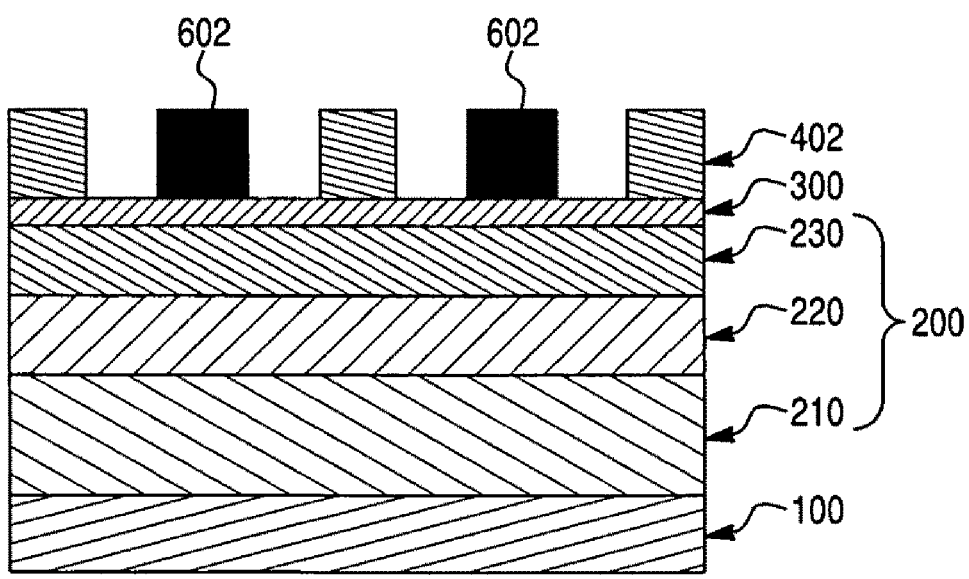

In an alternative embodiment, rather than removing the first features 402 as shown in FIG. 2D, first filler features 602 can be formed in the openings located between the spacer features 502, as illustrated in FIG. 2J. Then, the spacer features 502 are removed as shown in FIG. 2K. In this embodiment, a combination of the first filler features 602 and the first features 402, instead of the spacer features 502, are used a mask for etching the first hard mask layer 300 to form the first hard mask features 302, as shown in FIG. 2E.

Similar steps to those shown in FIGS. 2B-2E can then be conducted to form second hard mask features 304, resulting in a structure illustrated in FIGS. 2G (side cross-sectional view) and 3C (top view). For example, in some embodiments, the steps may comprise forming a second spacer layer (not shown) over the second features 404, etching the second spacer layer to form a second spacer pattern (not shown) and to expose top of the second features 404, removing the second features 404, etching the first hard mask features 302 using the second spacer pattern as a mask, and removing the second spacer pattern. The features 302 has a square, rectangular or quasi-rectangular shape (i.e., square or rectangle with rounded corners).

Figure 6:
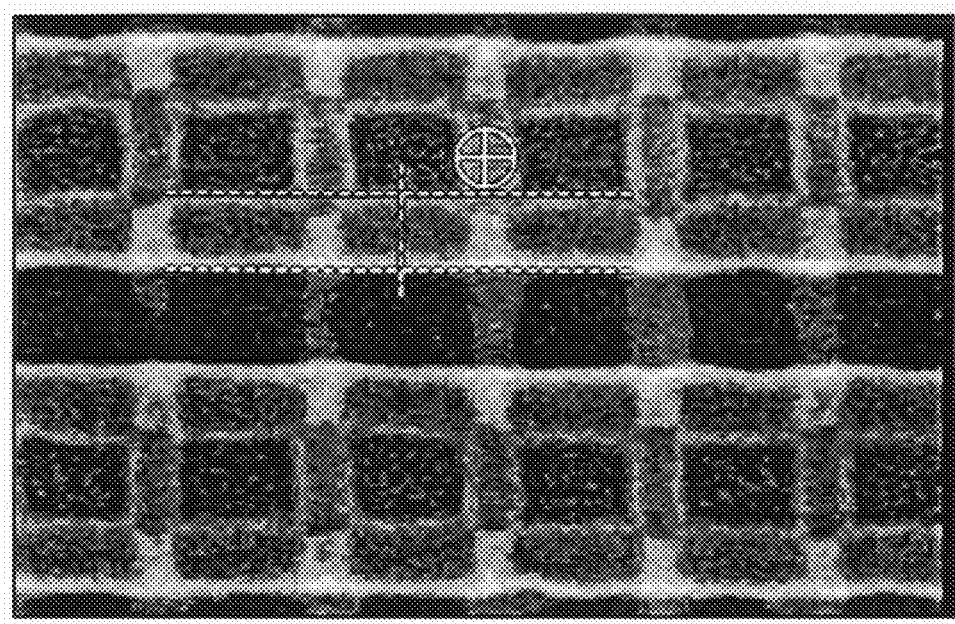
FIG. 6 is a SEM top image of a second non-limiting example at the stage after the step of removing the second spacer features.

A SEM top image of a second non-limiting working example, at the stage immediately after the step of removing the second spacer pattern, is shown in FIG. 6. In this non-limiting working example, the first hard mask layer is an amorphous silicon layer having a thickness of around 30 nanometers. The first and second spacer layer are silicon oxide. As shown in FIG. 6, the resulting features comprise pillars having a size of around 42×32 nm (length×width). Without wishing to be bound by a particular theory, the asymmetric critical dimension of the resulting structure, as shown in FIG. 6, may be explained by the variation of the oxide spacer layer deposition.

At least part of the underlying layer 200 can then be etched, using the second hard mask features 304 as a mask. In a preferred embodiment, the second hard mask layer 230 can be etched first using the second hard mask features 304 as a mask. The patterned second hard mask layer can then be used as a mask for etching the underlying hard mask layer 220 and the device layer 210. In some embodiments, the second hard mask layer 230 and a top portion of the underlying hard mask layer 220 may be removed during the step of etching the device layer 210. In a preferred embodiment, as shown in FIG. 2H (side cross-sectional view) and 3D (top view), an array of pillars 212, on top of which underlying hard mask features 222 (patterned underlying hard mask layer 220) remain may be obtained. In some embodiments, the remaining underlying hard mask features 222 can then be removed, resulting in a structure illustrated in FIG. 2I (side cross-sectional view) and 3E (top view).

The device layer 210 may comprise at least one semiconductor layer, and the step of patterning the device layer 200 forms an array of semiconductor pillars 212. Any suitable semiconductor materials such as silicon, germanium, silicon germanium, or other compound semiconductor materials, may be used. In these embodiments, each pillar 212 may comprise a diode. The diode 110 may be a steering element of a memory cell, for example, a memory cell 1 illustrated in FIG. 1B, which further includes a storage element 118. The storage element may comprise a resistivity switching element. The resistivity switching element can be a metal oxide antifuse dielectric layer or another element, and the diode and the metal oxide antifuse dielectric layer can be arranged in series.

Figure 7A:
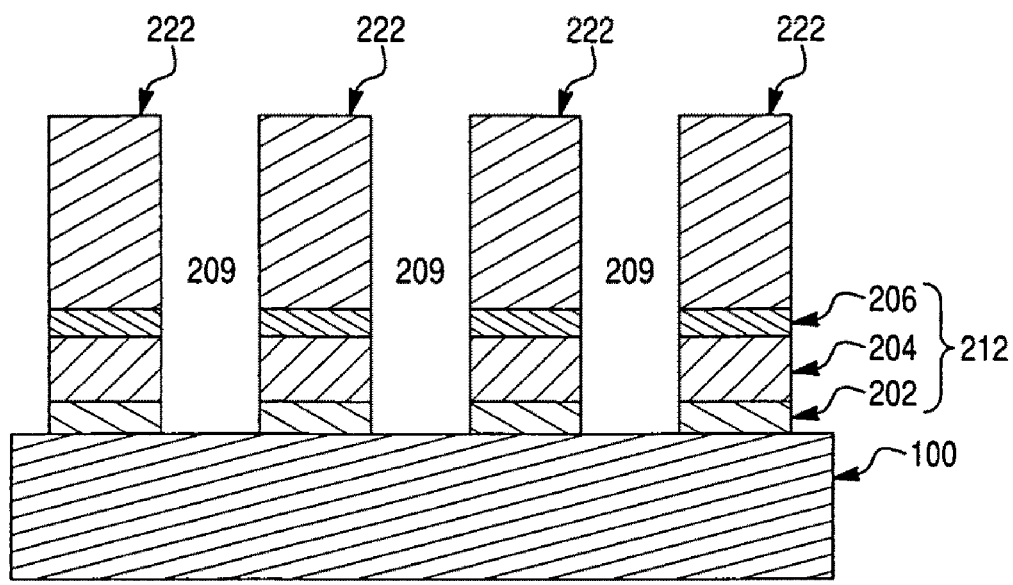
FIGS. 7A-7D are top views illustrating stages in formation of a device according to another embodiment of the present invention.

Alternatively, the device layer 210 comprises a resistivity switching storage element layer, for example, a metal-insulator-metal stack. As explained above, the step of etching the underlying layer 200 using the second hard mask features 304 as a mask, may result in pillars 212, on which underlying hard mask features 222 remain. In one embodiment, as shown in FIG. 7A, the pillars 212 (resistivity switching elements in this embodiment) may contain a first electrically conductive layer 202, an insulating layer 204 over the first electrically conductive layer 202, and a second electrically conductive layer 206. Any suitable conductive material can be used for the first 202 and second 206 conductive layers, for example, tungsten, aluminum, copper, or alloys thereof. The insulating layer 204 can be an antifuse dielectric layer selected from a group consisting of silicon oxide, hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or combinations thereof.

Figure 7B:
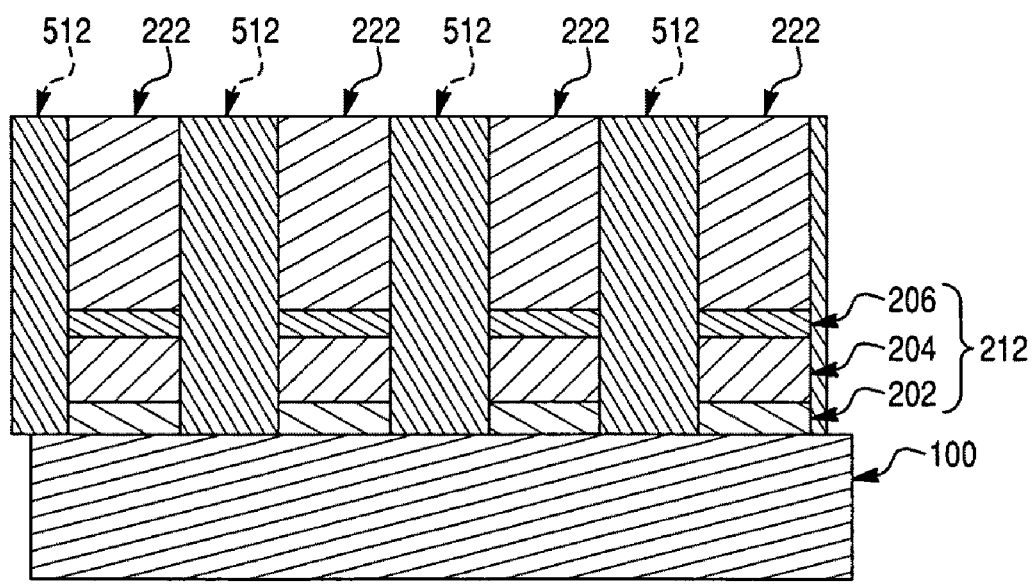

First openings 209 are formed between adjacent pillars 212 as illustrated in FIG. 7A. Turning to FIG. 7B, openings 209 are filled by an insulating material 512. Any suitable insulating material can be used for the insulating layer 512, for example silicon oxide, silicon nitride, high-dielectric constant film, Si—C—O—H film, or a combination thereof.

Figure 7C:
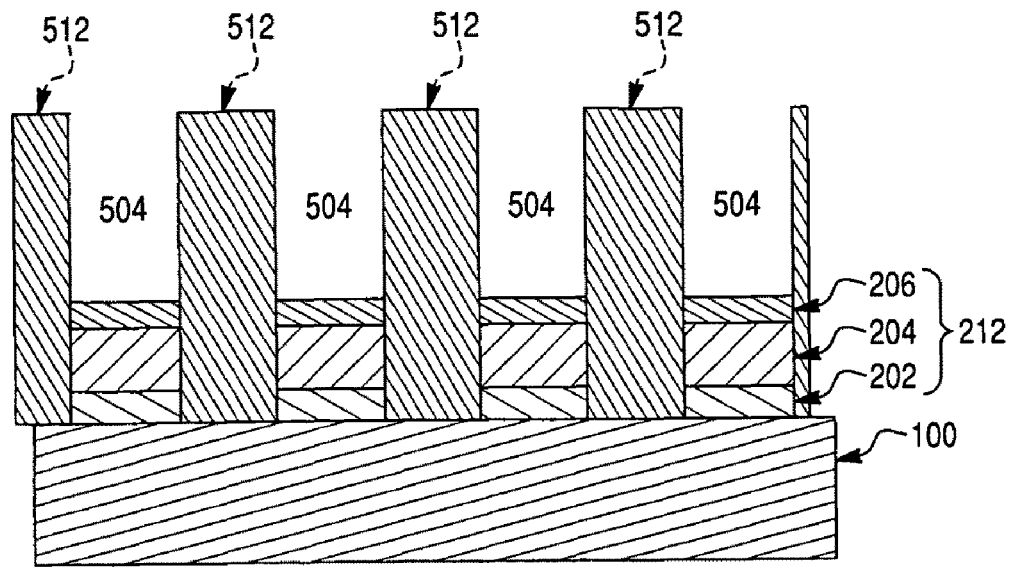
Figure 7D:
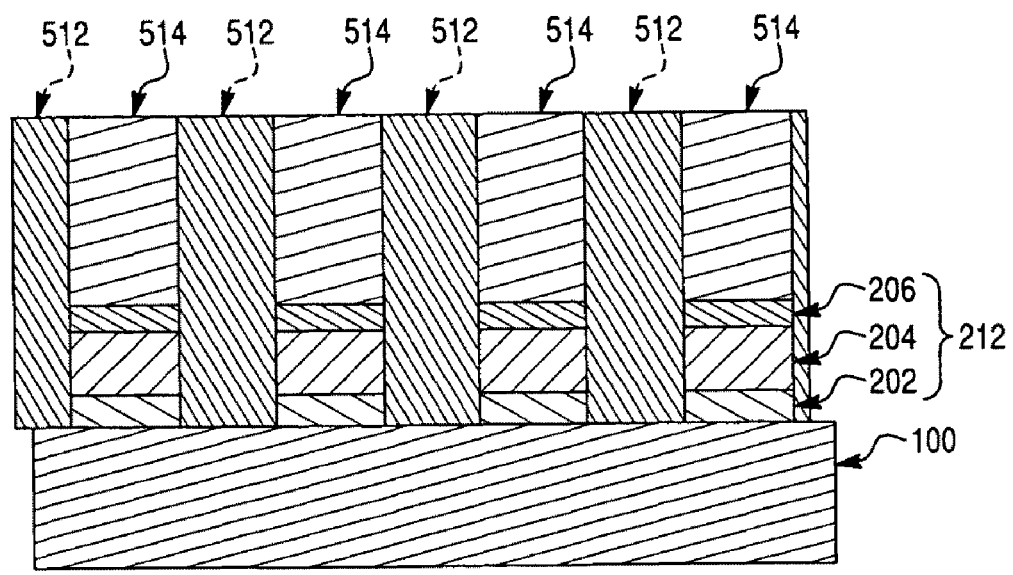

The underlying hard mask features 222 can then be selectively removed, as shown in FIG. 7C, forming second openings 504 exposing top of the resistivity switching storage element 212. The second openings 504 can then be filled with at least one semiconductor material to form semiconductor diodes 514, as shown in FIG. 7D. The semiconductor diodes 514 may have a substantially pillar shape, and may be a steering element of a memory cell, for example, the memory cell 1 illustrated in FIG. 1B.

The step of filling the second openings 504 may comprise selectively growing the semiconductor material of diodes 514 in the second openings 504. Alternatively, the step of filling the second openings 504 may comprise depositing the semiconductor material non-selectively over insulating layer 512 and into the second openings 504, and planarizing the semiconductor material such that the semiconductor material remains in the second openings 504. The p-type, n-type and optionally intrinsic diode regions may be deposited separately or the upper most layer (p or n-type) may be formed by implanting p or n-type dopants into the intrinsic region.

In some other embodiments, the device layer 210 comprises an electrically conductive material, such as a metal or metal alloy. In these embodiments, rather than etching the underlying layer using the second hard mask features 304 as a mask, the underlying layer is etched using the first hard mask features 302, comprising a plurality of lines, as a mask. In a preferred embodiment, the electrically conductive material can be patterned into line shaped electrodes, which may be electrodes of a memory cell, for example, a memory cell 1 illustrated in FIG. 1B, which further includes a storage element 118 and a steering element 110.

The memory cell can be further located in a monolithic three dimensional array of memory cells. The memory cell can be a read/write memory cell or a rewritable memory cell. The memory cell type (i.e., the resistivity switching storage element 118) can be selected from at least one of antifuse, fuse, polysilicon memory effect cell, metal oxide memory, switchable complex metal oxide, carbon nanotube memory, graphene, amorphous or polycrystalline carbon switchable resistance material, phase change material memory, conductive bridge element, or switchable polymer memory. U.S. application Ser. Nos. 11/864,532 and 11/819,595, U.S. Published Application Nos. US 2007/0164309 A1 and US 2007/0072360 A1, and U.S. Pat. Nos. 6,946,719, 6,952,030, 6,853,049, disclosing memory cells and methods of making and/or using thereof, are hereby incorporated by reference in their entirety.

Figure 1A:
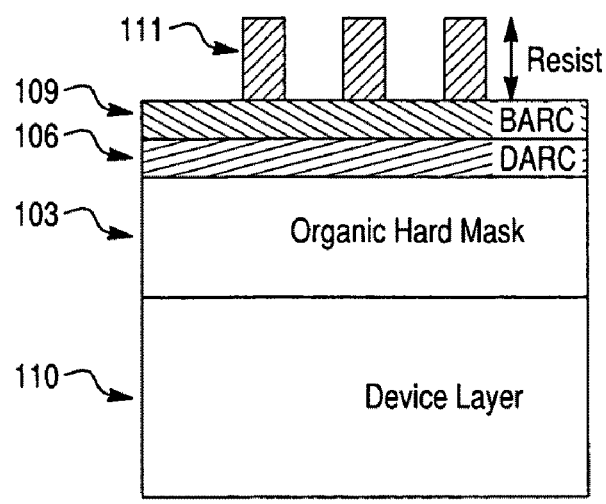
FIG. 1A is a side cross-sectional view illustrating a prior art hard mask configuration.
Figure 1B:
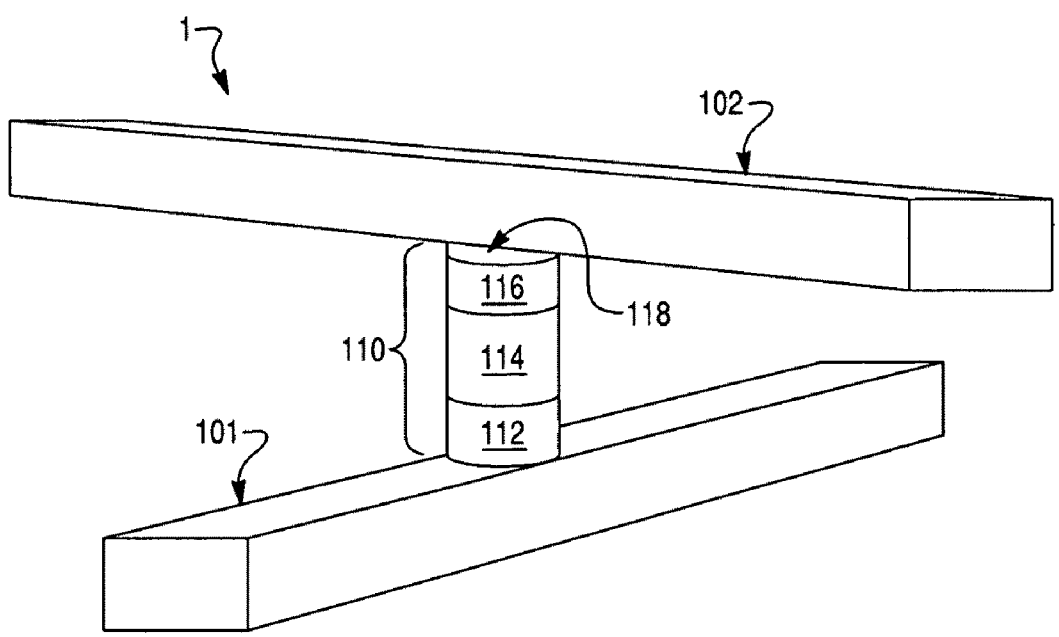
FIG. 1B is a perspective view of a memory cell formed according to an embodiment of the present invention.

In preferred embodiments, the memory cell includes a cylindrical, quasi-cylindrical or right angle parallelepiped semiconductor diode located in series with the storage element. The diode and the storage element are disposed between two electrodes, as illustrated in FIG. 1B. For a detailed description of a the design of a memory cell comprising a diode and an antifuse, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.), each of which is hereby incorporated by reference. In the preferred embodiments of the invention, the storage element is the resistivity switching material and the diode is the steering element of the memory cell. Each pillar memory cell 110/118 may have a critical dimension below 32 nm, such as 22 nm, and adjacent pillars may be spaced apart by less than 100 nm, such as 80-88 nm for example.

As a non-limiting example, FIG. 1B illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed. Such a diode, regardless of its orientation, will be referred to as a p-i-n diode or simply diode. The resistivity switching layer 118 is disposed on the diode, either on the p-type region 116 or below the n-region 112 of the diode 110. Top conductor 102 may be formed in the same manner and of the same materials as bottom conductor 101, and extends in a second direction different from the first direction. The semiconductor diode 110 is vertically disposed between bottom conductor 101 and top conductor 102. The diode can comprise any single crystal, polycrystalline, or amorphous semiconductor material, such as silicon, germanium, or silicon-germanium alloys.

The above described memory cell shown in FIG. 1B may be located in a one memory level device. If desired, additional memory levels can be formed above the first memory level to form a monolithic three dimensional memory array. In some embodiments, conductors can be shared between memory levels; i.e. top conductor 102 shown in FIG. 1B would serve as the bottom conductor of the next memory level. In other embodiments, an interlevel dielectric is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a device, comprising:
    forming a first hard mask layer over an underlying layer;
    forming first features over the first hard mask layer;
    forming a first spacer layer over the first features;
    etching the first spacer layer to form a first spacer pattern and to expose top of the first features;
    removing the first features;
    patterning the first hard mask, using the first spacer pattern as a mask, to form first hard mask features;

removing the first spacer pattern; forming second features over the first hard mask features;

forming a second spacer layer over the second features;

etching the second spacer layer to form a second spacer pattern and to expose top of the second features;

removing the second features; etching the first hard mask features, using the second spacer pattern as a mask, to form second hard mask features; and etching at least part of the underlying layer using the second hard mask features as a mask.

2. The method of claim 1, wherein:
the first features comprise a plurality of first parallel lines extending in a first direction;
the second features comprise a plurality of second parallel lines extending in a second direction, wherein the second direction differs from the first direction by 30 to 90 degrees; and
the step of etching at least part of the underlying layer forms an array of pillars.

3. The method of claim 1, wherein the first features and the second features comprise photoresist features.

4. The method of claim 3, further comprising forming a BARC layer by liquid phase depositing BARC material over and between the first hard mask features prior to forming the second features.

5. The method of claim 1, wherein:
the first spacer layer and the second spacer layer comprise a first material; and
the first features and the second features comprise a second material different from the first material.

6. The method of claim 1, wherein the first and second spacer layers comprise oxide spacers.

7. The method of claim 1, wherein the first hard mask layer is a DARC layer.

8. The method of claim 1, wherein the underlying layer is selected from a group consisting of a second hard mask layer, an organic hard mask layer, a device layer, or combinations thereof.

9. The method of claim 8, wherein the second hard mask layer comprises an oxide hard mask.

10. The method of claim 8, wherein the second hard mask layer comprises polysilicon.

11. The method of claim 8, wherein:
the device layer comprises at least one semiconductor layer; and
the step of etching the underlying layer forms an array of semiconductor pillars.

12. The method of claim 11, wherein each pillar in the array of pillars comprises a diode.

13. The method of claim 12, wherein the diode is a steering element of a memory cell and wherein the memory cell further comprises a storage element.

14. The method of claim 13, wherein the memory cell type is selected from at least one of antifuse, fuse, polysilicon memory effect cell, metal oxide memory, switchable complex metal oxide, carbon nanotube memory, graphene or polycrystalline carbon switchable resistance material, phase change material memory, conductive bridge element, or switchable polymer memory.

15. The method of claim 13, wherein the storage element comprises a resistivity switching element.

16. The method of claim 13, wherein the memory cell is a read/write memory cell or a rewritable memory cell.

17. The method of claim 13, wherein the memory cell is located in a monolithic three dimensional array of memory cells.

18. A method of making a device, comprising:
forming a first hard mask layer over a plurality of underlying layers, wherein the plurality of underlying layers comprise a resistivity switching storage element layer and an underlying hard mask layer over the resistivity switching storage element layer;
forming first features over the first hard mask layer;
forming a first spacer layer over the first features; etching the first spacer layer to form first spacer pattern to expose top of the first features;
removing the first features;
etching the first hard mask using the first spacer pattern as a mask to form first hard mask features; removing the first spacer pattern;
forming second features over the first hard mask features;
forming a second spacer layer over the second features;
etching the second spacer layer to form a second spacer pattern to expose top of the second features;
etching the first hard mask layer to form second hard mask features using the second spacer pattern as a mask;
etching at least the resistivity switching storage element layer and the underlying hard mask layer, using the second hard mask features as a mask, to form first openings;
filling the first openings with an insulating material;
removing the second hard mask features; forming second openings exposing top of the resistivity switching storage element layer by removing the underlying hard mask layer; and
filling the second openings with at least one semiconductor material to form semiconductor diodes having a substantially pillar shape in the second openings.

19. The method of claim 18, wherein the underlying hard mask layer comprises an organic hard mask.

20. The method of claim 18, wherein:
the resistivity switching storage element layer comprises a metal-insulator-metal stack; and
conductive layers of the metal-insulator-metal stack are independently selected from a group consisting of titanium or titanium nitride.

21. The method of claim 18, wherein the step of filling the second openings comprises selectively depositing the semiconductor material into the second openings.

22. The method of claim 18, wherein the step of filling the second openings comprises:
depositing the semiconductor material non-selectively over the underlying layer and into the second openings; and
planarizing the semiconductor material such that the semiconductor material remains in the second openings.

23. The method of claim 18, wherein:
each of the semiconductor diodes comprises a steering element of a memory cell; and
the memory cell further comprises a storage element comprising a portion of the etched resistivity switching storage element layer.

24. The method of claim 18, wherein:
the first features comprise a plurality of first parallel lines extending in a first direction; and
the second features comprise a plurality of second parallel lines extending in a second direction, wherein the second direction differs from the first direction by 30 to 90 degrees.

25. The method of claim 18, wherein the first features and the second features comprise photoresist features.

26. The method of claim 18, wherein:
the first spacer layer and the second spacer layer comprise a first material; and
the first features and the second features comprise a second material different from the first material.

27. The method of claim 18, wherein the plurality of underlying layers further comprises a second hard mask layer.

28. The method of claim 27, wherein the second hard mask layer comprises an oxide hard mask.

29. The method of claim 27, wherein the second hard mask layer comprises polysilicon.

\* \* \* \* \*